(12) United States Patent
Rieve et al.

(10) Patent No.: US 7,701,023 B2
(45) Date of Patent: Apr. 20, 2010

(54) TFA IMAGE SENSOR WITH STABILITY-OPTIMIZED PHOTODIODE

(75) Inventors: Peter Rieve, Windeck-Dattenfeld (DE); Marcus Walder, Wipperfuerth (DE); Konstantin Seibel, Siegen (DE); Jens Prima, Gehrde (DE); Arash Mirhamed, Vellmar (DE)

(73) Assignee: STMicroelectronics N.V., Amsterdam (NL)

(*) Notice: Subject to any disclaimer, the term of this patent is extended or adjusted under 35 U.S.C. 154(b) by 110 days.

(21) Appl. No.: 11/875,460

(22) Filed: Oct. 19, 2007

(65) Prior Publication Data

US 2008/0128697 A1 Jun. 5, 2008

Related U.S. Application Data

(63) Continuation of application No. 10/521,427, filed as application No. PCT/EP03/007593 on Jul. 14, 2003, now abandoned.

(30) Foreign Application Priority Data

Jul. 16, 2002 (DE) .................................. 102 32 019

(51) Int. Cl.
*H01L 27/14* (2006.01)
*H01L 31/00* (2006.01)
*H01L 31/0232* (2006.01)
*H01L 21/00* (2006.01)

(52) U.S. Cl. .................. 257/431; 257/233; 257/428; 257/432; 257/433; 257/E21.366; 257/E27.122; 438/22; 438/48; 438/54; 438/57; 438/73

(58) Field of Classification Search .................. 257/233, 257/428, 433, E21.366, E27.122; 438/22, 438/48, 54, 57, 69, 73
See application file for complete search history.

(56) References Cited

U.S. PATENT DOCUMENTS

| 5,093,546 | A | 3/1992 | Matsumiya et al. |
| 6,373,117 | B1 | 4/2002 | Theil |
| 6,518,558 | B1 * | 2/2003 | Bohm et al. .............. 250/208.1 |

(Continued)

FOREIGN PATENT DOCUMENTS

WO     WO 99/00848     1/1999

(Continued)

OTHER PUBLICATIONS

International Search Report from corresponding International Application No. PCT/EP03/07593, filed Jul. 14, 2003.

*Primary Examiner*—Ida M Soward
(74) *Attorney, Agent, or Firm*—Lisa K. Jorgenson; James H. Morris; Wolf, Greenfield & Sacks, P.C.

(57) ABSTRACT

A TFA (thin film on ASIC) image sensor with stability-optimized photodiode for converting electromagnetic radiation into an intensity-dependent photocurrent. The TFA includes an intermetal dielectric layer, pixel back electrodes, vias, metal contacts, a transparent conductive oxide (TCO) layer, and an intrinsic absorption layer with a thickness between 300 nm and 600 nm. The pixel back electrodes are disposed over the intermetal dielectric layer, which is disposed over the ASIC. The vias connect to the pixel back electrodes and the metal contacts, which are formed in the intermetal dielectric layer. The TCO is disposed above the intrinsic absorption layer, which is disposed above the pixel back electrodes.

28 Claims, 11 Drawing Sheets

U.S. PATENT DOCUMENTS

| | | |
|---|---|---|
| 6,586,812 B1 | 7/2003 | Cao et al. |
| 7,053,357 B2 * | 5/2006 | Schwarte ................. 250/214.1 |
| 7,053,457 B2 * | 5/2006 | Rieve et al. ................. 257/449 |
| 7,238,927 B1 * | 7/2007 | Hartman et al. .......... 250/208.2 |
| 7,248,297 B2 * | 7/2007 | Catrysse et al. ............. 348/273 |
| 7,259,364 B2 * | 8/2007 | Lule ........................ 250/214.1 |
| 7,326,589 B2 * | 2/2008 | Rieve et al. ................... 438/57 |
| 2003/0111675 A1 * | 6/2003 | Yao ............................ 257/233 |
| 2003/0157581 A1 * | 8/2003 | Grill et al. ..................... 435/8 |
| 2004/0113220 A1 | 6/2004 | Rieve et al. |
| 2005/0285956 A1 * | 12/2005 | Wagner et al. .............. 348/272 |

FOREIGN PATENT DOCUMENTS

| | | |
|---|---|---|
| WO | WO 02/071497 A1 | 9/2002 |
| WO | WO 03/038901 A1 | 5/2003 |

* cited by examiner

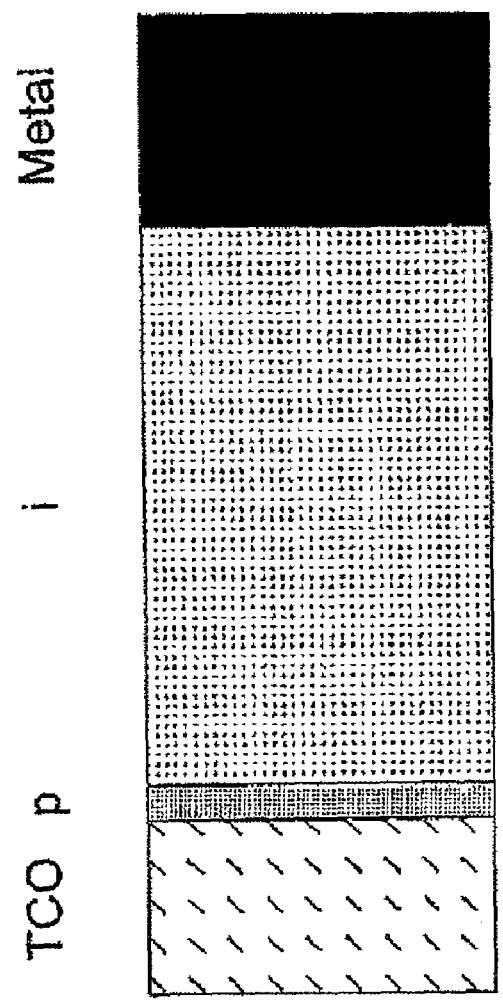
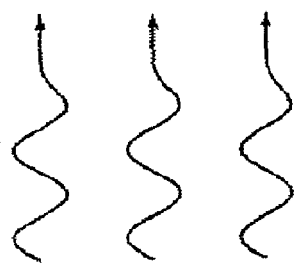
Fig. 2

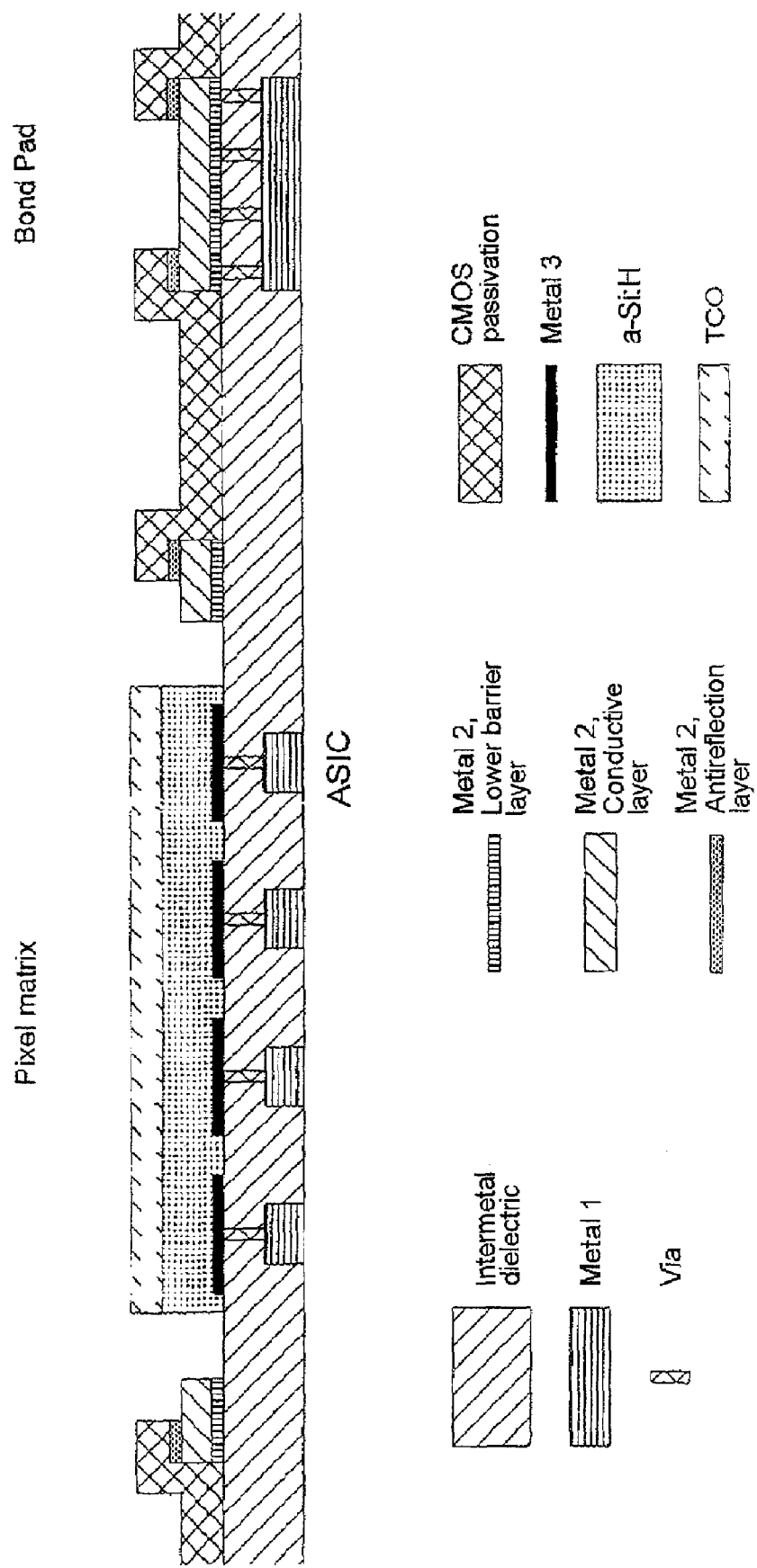

TFA IMAGE SENSOR WITH STABILITY-OPTIMIZED PHOTODIODE

RELATED APPLICATIONS

This is a continuation of prior application Ser. No. 10/521,427, which is turn claims priority International Application Ser. No. PCT/EP/2003/007593, filed Jul. 14, 2003, which in turn claims prior to German application Ser. No. 10232019.5, filed Jul. 16, 2002, entitled "TFA IMAGE SENSOR WITH STABILITY-OPTIMIZED PHOTODIODE", which are herein incorporated by reference in their entirety.

BACKGROUND OF THE INVENTION

1. Field of the Invention

The present patent application relates to a TFA image sensor with stability-optimized photodiode for converting electromagnetic radiation into an intensity-dependent photocurrent with an intermetal dielectric, on which, in the region of the pixel matrix, a lower barrier layer (metal 2) is situated and a conductive layer (metal 2) is situated on said barrier layer, and vias being provided for the contact connection to the ASIC, said vias in metal contacts on the ASIC.

2. Discussion of the Related Art

A TFA sensor (Thin Film on ASIC (TFA) Technology) comprises a matrix-organized or linear arrangement of pixels. The electronic circuits for operating the sensor (e.g. pixel electronics, peripheral electronics, system electronics) are usually realized using CMOS-based silicon technology and form an application specific integrated circuit (ASIC).

Isolated therefrom by an insulating layer and connected thereto by means of corresponding electrical contacts, there is situated on the ASIC a multilayer arrangement as photodiode, which performs the conversion of electromagnetic radiation into an intensity-dependent photocurrent. Said photocurrent is transferred at specific contacts—present in each pixel—of the pixel electronics underneath (B. Schneider, P. Rieve, M. Böhm, Image Sensors in TFA (Thin Film on ASIC) Technology, ed. B. Jähne, H. Hausecker, P. Geißler, Handbook of Computer Vision and Applications, pp. 237-270, Academic Press, San Diego, 1999).

According to the prior art (J. A. Theil, M. Cao, G. Kooi, G. W. Ray, W. Greene, J. Lin, A J. Budrys, U. Yoon, S. M a, H. Stork, Hydrogenated Amorphous Silicon Photodiode Technology for Advanced CMOS Active Pixel Sensor Imagers, MRS Symposium Proceedings, vol. 609, 2000), what is used as photodiode is a pin configuration based on amorphous silicon, i.e. a sequence comprising a p-conducting, an intrinsically conducting (intrinsic) and an n-conducting amorphous silicon layer. The n-type layer usually forms the bottom most layer facing the ASIC.

The electrical contacts are formed by a metal layer, for example, on said side facing the ASIC, while the contact connection on the side facing the direction of light incidence is generally effected by a transparent and conductive layer.

Over and above the pin photodiode mentioned, further component structures are also possible, e.g. Schottky photodiodes, in which an intrinsic semiconductor layer is brought into contact with a suitable metal (for example chromium, titanium, platinum, palladium, silver), so that the metal-semiconductor junction forms a Schottky photodiode.

A typical layer configuration is disclosed in the patent application TFA image sensor with extremely low dark current, Y, S, Seruak Bi, Ser. No. 10/541,440. Furthermore, detector structures with a controllable spectral sensitivity are known (P. Rieve, M. Sommer, M. Wagner, K. Seibel, M. Böhm, a-Si:H Color Imagers and Colorimetry, Journal of Non-Crystalline Solids, vol. 266-269, pp. 1168-1172, 2000). This basic structure of a TFA image sensor can furthermore be extended by additional, upstream layers in the direction of light incidence, for example by color filter layers (e.g. Bayer pattern, U.S. Pat. No. 3,971,065).

If amorphous silicon is used as photoactive sensor material, then the metastability observed in the case of this material becomes apparent, under certain circumstances. Hydrogenated amorphous silicon (a-Si:H) comprises a silicon-hydrogen atomic composite lacking a long-range order as is typical of semiconductor crystals. Modifications of the atom bonding parameters occur with respect to the ideal semiconductor crystal. The consequence of this is that, in the context of the solid-state band model, a state density that differs from zero exists in the band gap between conduction band and valence band, which affects the electrical and optical properties of the material. States in the middle of the band gap predominantly act as recombination centers, while states in the vicinity of the band edges function as traps for charge carriers. On account of light being radiated in or injection of charge carriers, more precisely through recombination of injected charge carriers, weak silicon bonds are broken and additional band gap states arise.

These band gap states caused by light irradiation represent additional recombination or trapping centers and influence the charge carrier transport and the distribution of the electric field strength in the components fabricated from amorphous silicon. In pin photodiodes, for example, predominantly positively charged states are concentrated in traps in that region of the intrinsic layer (i-type layer) which adjoins the p-type layer, and negatively charged states in that region of the i-type layer which adjoins the n-type layer. These stationary charges result in a decrease in the magnitude of the electric field strength within the i-type layer, so that the accumulation of photogenerated charge carriers deteriorates. An efficient charge carrier accumulation in pin photodiodes made of amorphous silicon is provided when the drift length ($\mu\tau E$) of the charge carriers significantly exceeds the thickness d of the intrinsic layer:

$$\mu\tau E \gg d \tag{1}$$

On account of the increase in the defect density associated with light being radiated in, on the one hand the lifetime $\tau$ is reduced due to intensified recombination of charge carriers and on the other hand the electric field E is reduced on account of the charged states in the i-type layer. Both have the consequence that the ratio of drift length to i-type layer thickness is reduced and the photocurrent thus decreases. The decrease in the photocurrent becomes apparent particularly when the photodiode is operated near the short-circuit point without additional reverse voltage, i.e. when only the built-in potential difference brought about by the doped layers is effective.

When reverse voltage is applied, by contrast, the electric field intensifies, so that the charge carrier accumulation is impaired to a less extent. The essential consequence of the light irradiation of a photodiode made of amorphous silicon with regard to the photocurrent thus consists in a reduction of the photocurrent saturation.

The dark current of an a-Si:H photodiode, i.e. the current which flows even in the unilluminated state is likewise influenced by the degradation of the material. On account of the defect states additionally generated by light being radiated in, the thermal generation of charge carriers increases in the case of a reverse-biased photodiode (extraction), which is manifested in an increase in the dark current.

SUMMARY OF THE INVENTION

The invention is now based on the object of providing a TFA image sensor with stability-optimized photodiode for converting electromagnetic radiation into an intensity-dependent photocurrent having improved electrical properties.

The formulated object on which the invention is based is achieved, in the case of a TFA image sensor with stability-optimized photodiode for converting electromagnetic radiation into an intensity-dependent photocurrent, in that a layer thickness of the intrinsic absorption layer of between 300 nm and 600 nm is provided.

Further refinements of the invention emerge from the associated subclaims.

The object on which the invention is based is furthermore achieved by means of a method which is characterized in that, before the application of the photodiodes, the topmost, comparatively thick metal layer of the ASIC is removed and replaced by a matrix of thin metal electrodes which form the back electrodes of the photodiodes, said matrix being patterned in the pixel raster.

Further refinements of the method according to the invention emerge from the associated subclaims.

BRIEF DESCRIPTION OF THE DRAWINGS

FIG. 2 is an illustration of a Schottky photodiode;

FIG. 11 illustrates the photodiode-forming layers applied to the pixel back electrodes after patterning.

DETAILED DESCRIPTION

Figure 1:
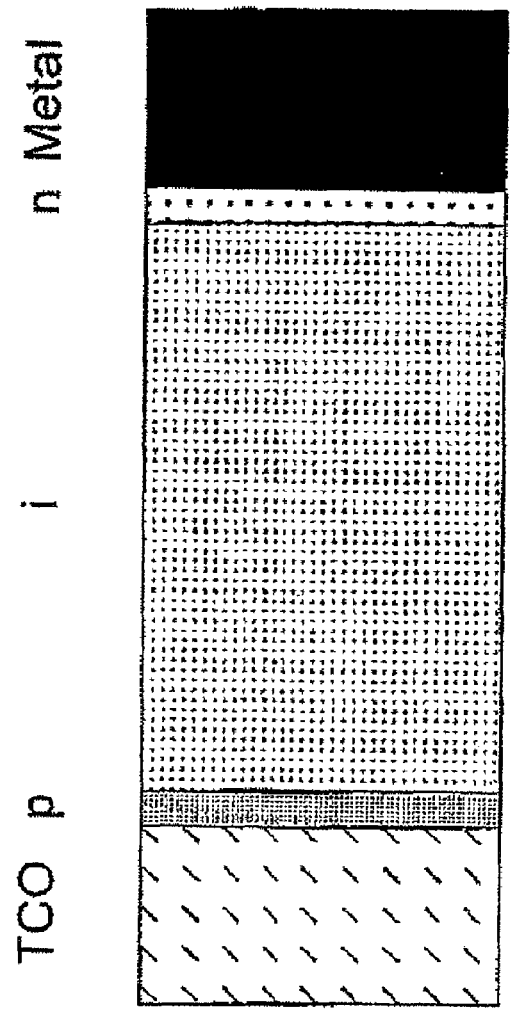
FIG. 1 is an illustration of a pin.

One particular refinement of the invention is characterized by opening of the ASIC passivation in the photoactive region of the TFA sensor, removal of the antireflection layer of the upper metalization layer of the ASIC in the photoactive region of the TFA sensor, removal of the conductive layer of the upper metallization layer of the ASIC in the photoactive region of the TFA sensor, patterning or removal of the lower barrier layer of the upper metalization layer of the ASIC in the photoactive region of the TFA sensor, deposition and patterning of a further metal layer, deposition and patterning of the photodiode layers, and deposition and patterning of further layers, such as color filter layers.

The changes in the dark current and photocurrent brought about by light being radiated in are reduced, according to the invention, by reducing the thickness of the intrinsic layer. This measure brings about an increase in the electric field strength over the i-type layer, so that the field strength depth caused by the increase in the defect density on account of light being radiated in, within the i-type layer, is less sharply pronounced.

In this way, the accumulation condition for photogenerated charge carriers which is given by equation (1) can be met even in the state of increased defect density (after light has been radiated in), and a decrease in photosensitivity is avoided. With regard to the behavior of the photodiode without illumination, photodiodes with a small i-type layer thickness, in the aged state, have a lower dark current than those with a thick i-type layer, which can be attributed to the smaller number of generation centers present in the band gap.

The method of improving the stability of photodiodes made of amorphous silicon by means of a thin absorber layer is known from the field of photovoltaic technology, where it is employed successfully in solar cells based on amorphous silicon. Application to image sensors in TFA technology is novel. The method is suitable both for photodiodes of the pin or nip type and for Schottky diodes. A layer thickness of the intrinsic absorption layer of between 300 nm and 600 nm has proved to be advantageous with regard to the stability of the photodiode, and it should preferably be approximately 450 nm.

One advantageous development consists in increasing the band gap of the intrinsic absorber layer of the photodiode. The dark current can be reduced in this way. At the same time, it is possible to counteract the increase in the diode capacitance which accompanies the reduction of the i-type layer thickness. Technologically, it is possible to increase the band gap for example by using an amorphous silicon-carbon alloy (a-SiC:H) as absorption layer.

In photodiodes with a small i-type layer thickness, the configuration of the surface on which the diode is situated is of crucial importance for the magnitude of the dark current. Besides the thermal generation currents already mentioned, inhomogeneities of the ASIC surface form, caused by the structures (metal tracks, holes in passivation layer, etc.) situated thereon, a further source of undesirably high dark currents in TFA image sensors. In this case, the influence of the surface topography is greater, the thinner the photodiode situated thereon. In this respect, it is necessary in particular to deposit the photodiode of reduced layer thickness on a surface that is as planar as possible.

One advantageous development of the invention thus consists in depositing the photodiode with small i-type layer thickness (as mentioned above) on an ASIC having a flat surface topography. This is ensured by the fabrication process explained below. The ASIC can, but need not necessarily, be coated with a passivation.

Within the pixel matrix, firstly the back electrodes of all the pixels are connected to one another via the topmost CMOS metal plane, which is made planar in the region of the pixel matrix. This metal area is situated on a CMP-planarized surface (CMP=Chemical Mechanical Polishing) of the topmost intermetal dielectric layer. Before the application of the photodiodes, this topmost, comparatively thick metal layer of the ASIC is removed and replaced by a matrix of thin metal electrodes which form the back electrodes of the photodiodes, said matrix being patterned in the pixel raster. The topmost metallization of the ASIC generally comprises a multilayered arrangement comprising a lower barrier layer, e.g. titanium nitride or titanium, the actual conductive layer, e.g. aluminum (alloys) and, if appropriate, an upper antireflection layer, e.g. titanium nitride. In an expedient manner, the antireflection layer (if present) and the metal layer are completely removed above the pixel matrix, so that all that remains is the lower barrier layer. The latter is then patterned in the pixel raster and either forms the pixel back electrode directly, or it is coated with a further metal layer, e.g. chromium, which forms the matrix of the pixel back electrodes after a further patterning step. As an alternative, the lower barrier layer is completely removed, this then being followed by the deposition and patterning of the further metal layer in the form of pixel back electrodes.

The process steps are summarized below as key points:

a) if appropriate opening of the ASIC passivation in the photoactive region of the TFA sensor, b) if appropriate removal of the antireflection layer of the upper metallization layer of the ASIC in the photoactive region of the TFA sensor, c) removal of the conductive layer of the upper metallization layer of the ASIC in the photoactive region of the TFA sensor, d) patterning or removal of the lower barrier layer of the upper metallization layer of the ASIC in the photoactive region of the TFA sensor, e) if appropriate deposition and patterning of a further metal layer, f) deposition and patterning of the photodiode layers, g) if appropriate deposition and patterning of further layers (e.g. color filter layers).

In this way, a largely planar surface is ensured in the region of the active pixel matrix of the sensor because the etching attack into the topmost intermetal dielectric layer is reduced to a minimum. It is only during the patterning or removal of the lower barrier layer of the topmost ASIC metallization layer that the CMP-planarized dielectric layer is uncovered and is removed locally by the etching attack, which can be minimized by a suitable choice of process parameters. Apart from that, the flat surface topography of the CMP planarization is maintained, thus avoiding any influencing of the dark current of the photodiodes deposited thereon.

The invention is explained below with reference to some drawings. FIGS. 1 and 2 show a pin and, respectively, a Schottky photodiode with an intrinsic absorption layer i according to the invention made of amorphous silicon in the layer thickness range of between 300 nm and 600 nm. The following figures relate to the abovementioned fabrication process which ensures a largely planar surface topography.

In this case, the illustrations only include the topmost layers of the ASIC which are relevant to the interface with the TFA layers.

Figure 3:
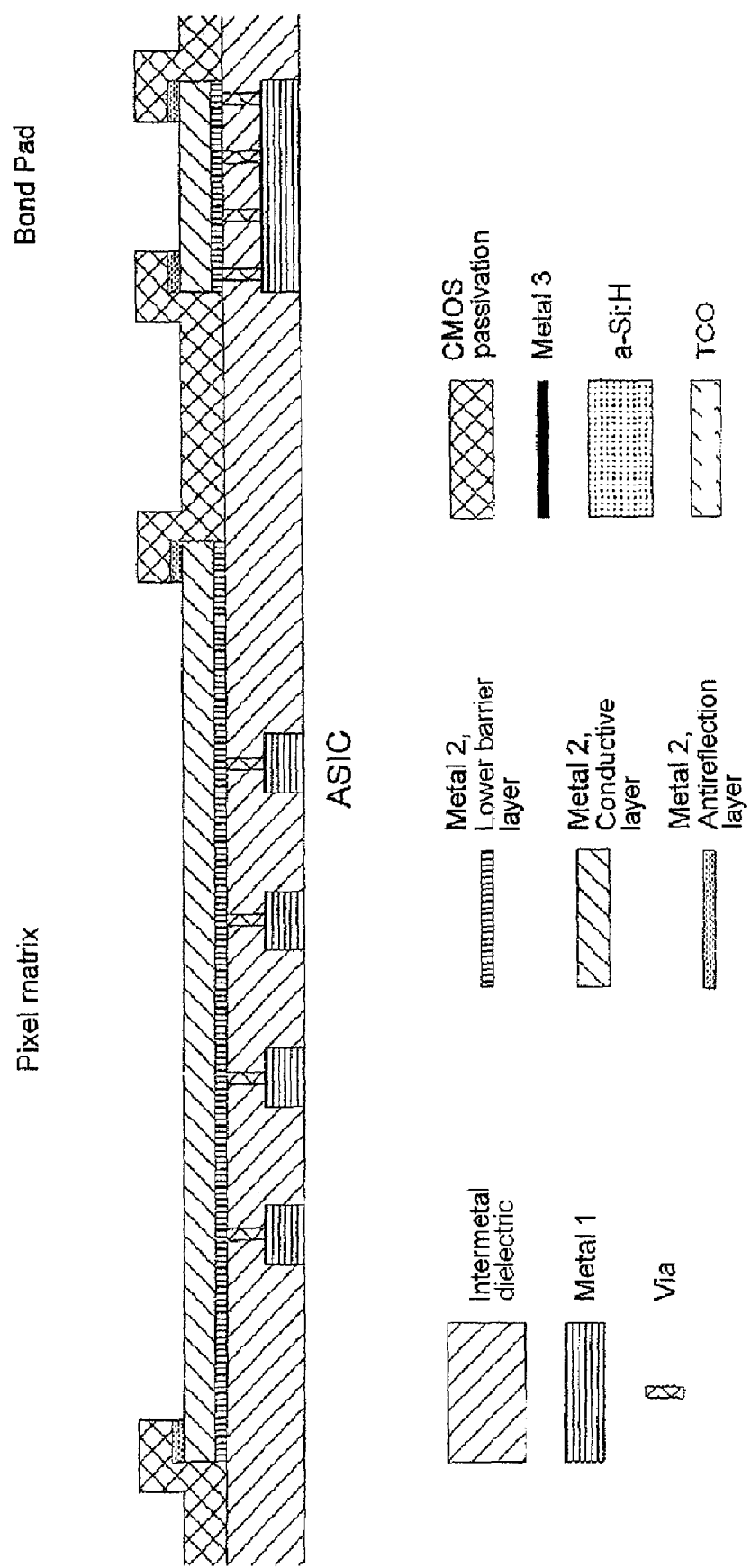
FIG. 3 illustrates the initial state before the beginning of the TFA processing.

FIG. 3 illustrates the initial state before the beginning of the TFA processing in the form of a passivated ASIC with passivation that has been opened in the region of the pixel matrix. The antireflection layer of the topmost metallization layer of the ASIC is likewise removed in the pixel region.

In this case, firstly an intermetal dielectric is arranged on the ASIC and, in the region of the pixel matrix, a lower barrier layer (metal 2) is situated on said intermetal dielectric and a conductive layer (metal 2) is situated on said barrier layer. Vias are provided for the contact connection to the ASIC, said vias ending in metal contacts on the ASIC. Furthermore, a bond pad (metal 2) for external contact connection is provided, which is contact-connected to the ASIC by means of vias and a metal 1.

Figure 4:
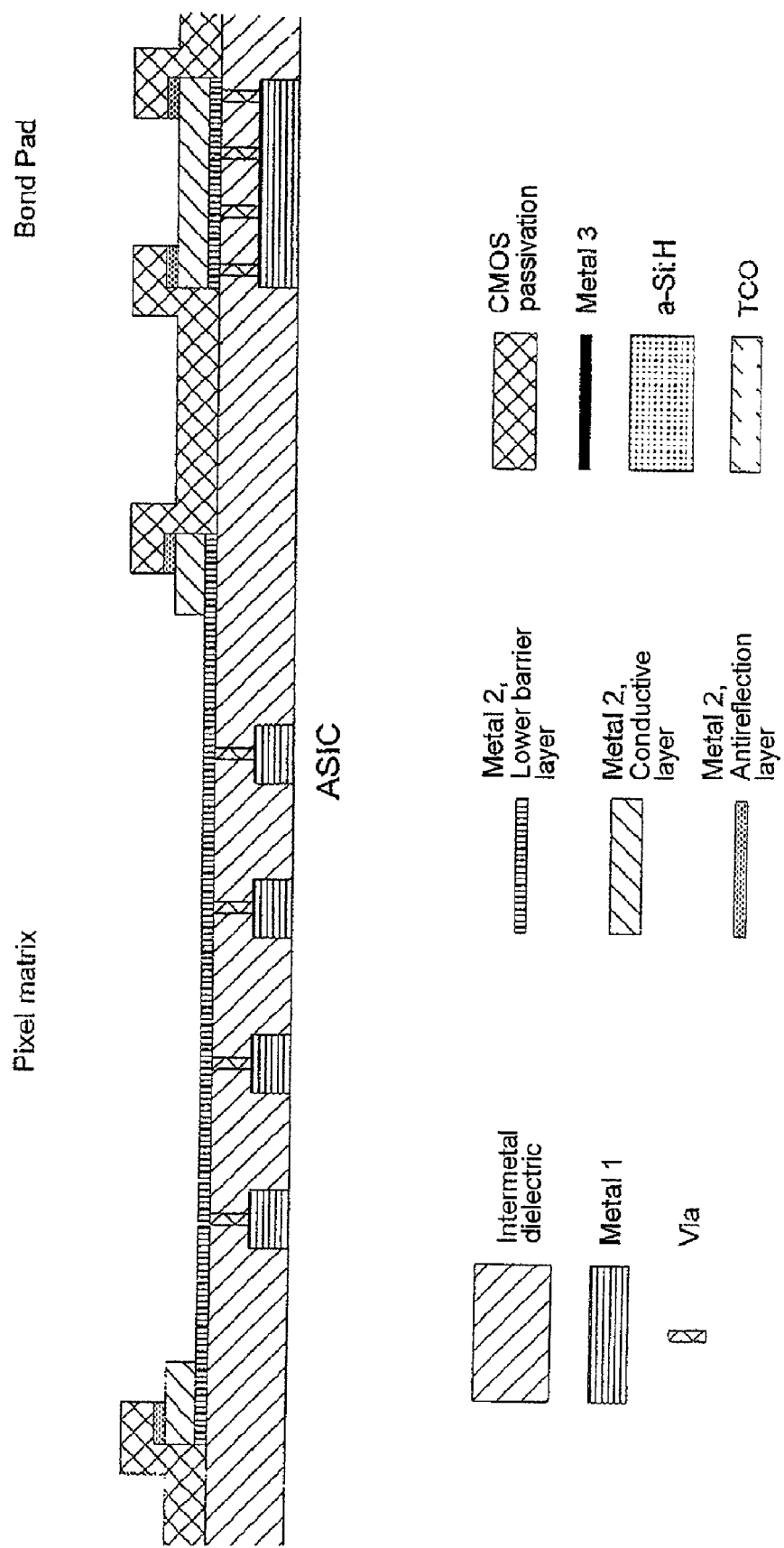
FIG. 4 illustrates the state after the removal of the conductive layer of the topmost metallization.

The state after the removal of the conductive layer of the topmost metallization is recorded in FIG. 4.

Figure 5:
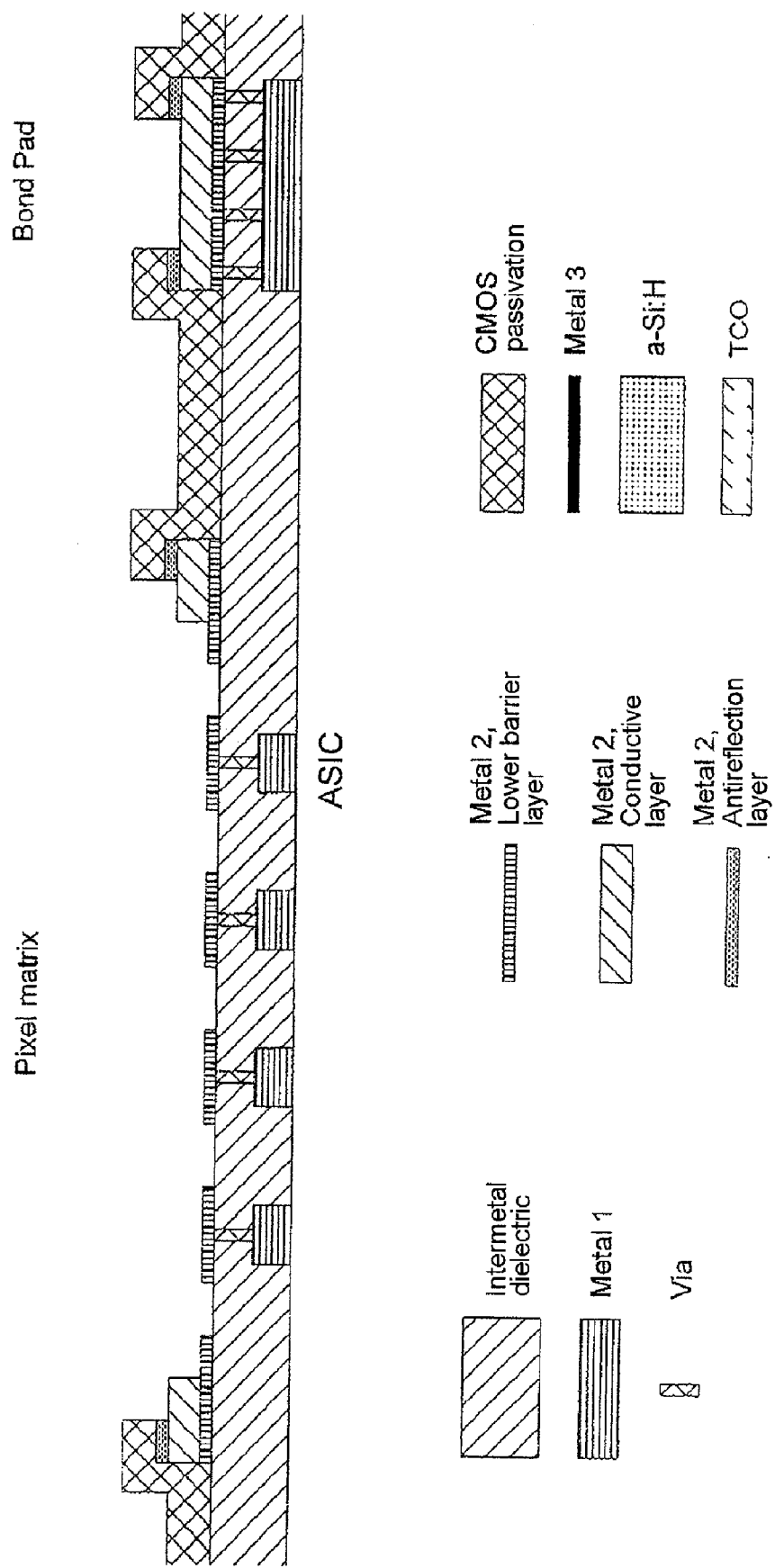
FIG. 5 illustrates the result after the patterning of the lower barrier layer.
Figure 6:
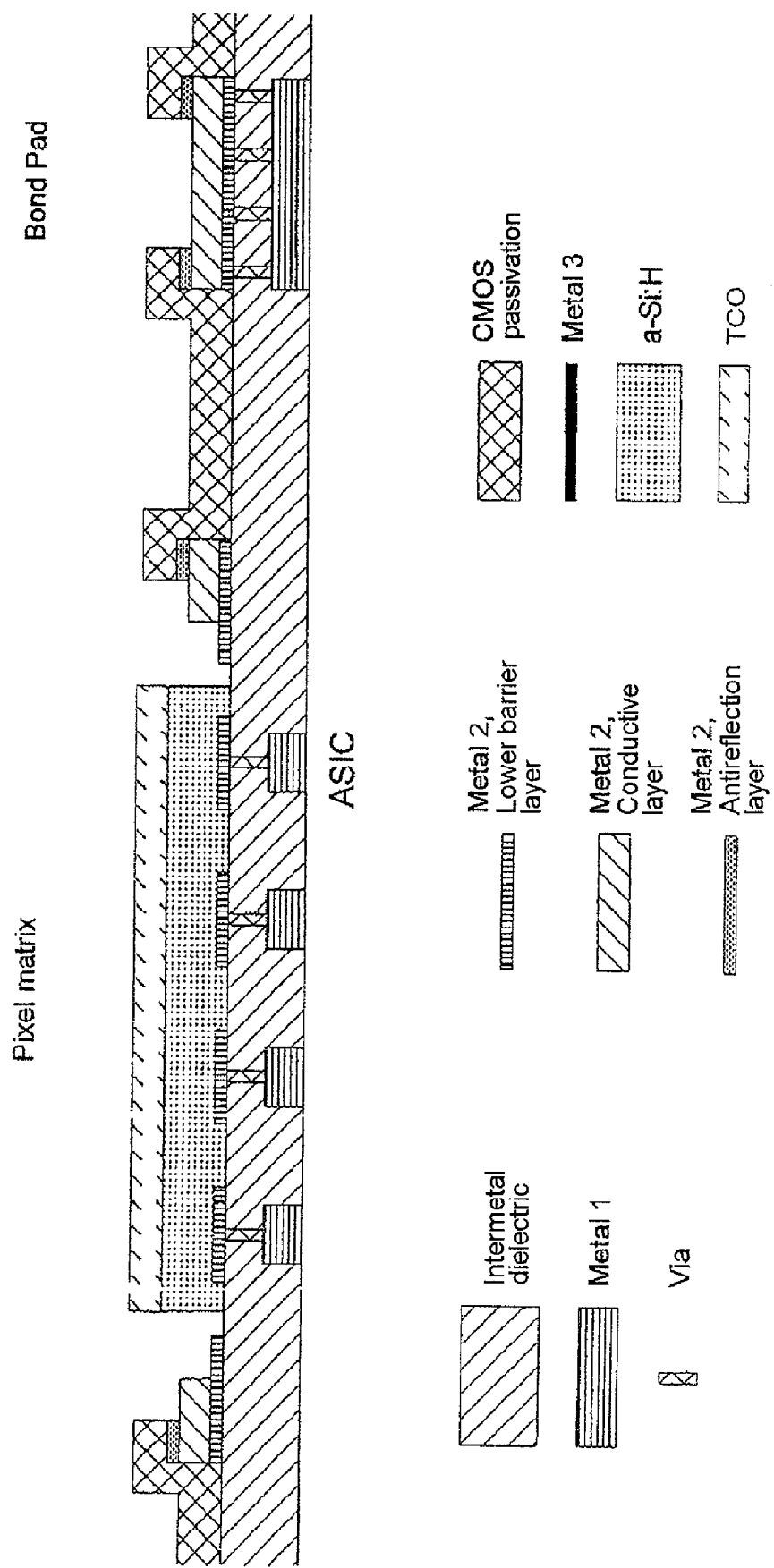
FIG. 6 illustrates the pixel back electrodes coated with the multilayer system comprising amorphous silicon and TCO (Transparent Conductive Oxide)
Figure 7:
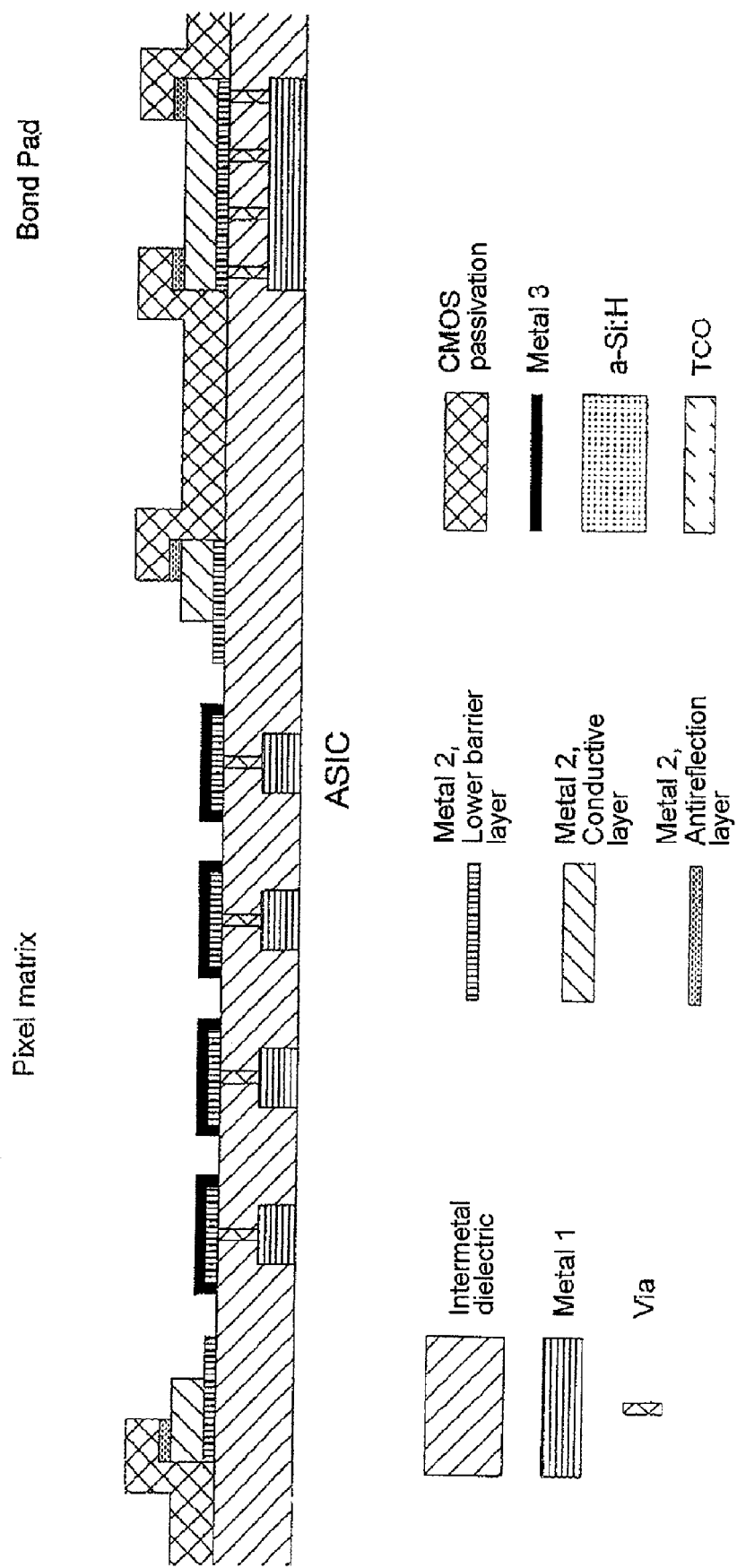
FIG. 7 illustrates a process variant.
Figure 8:
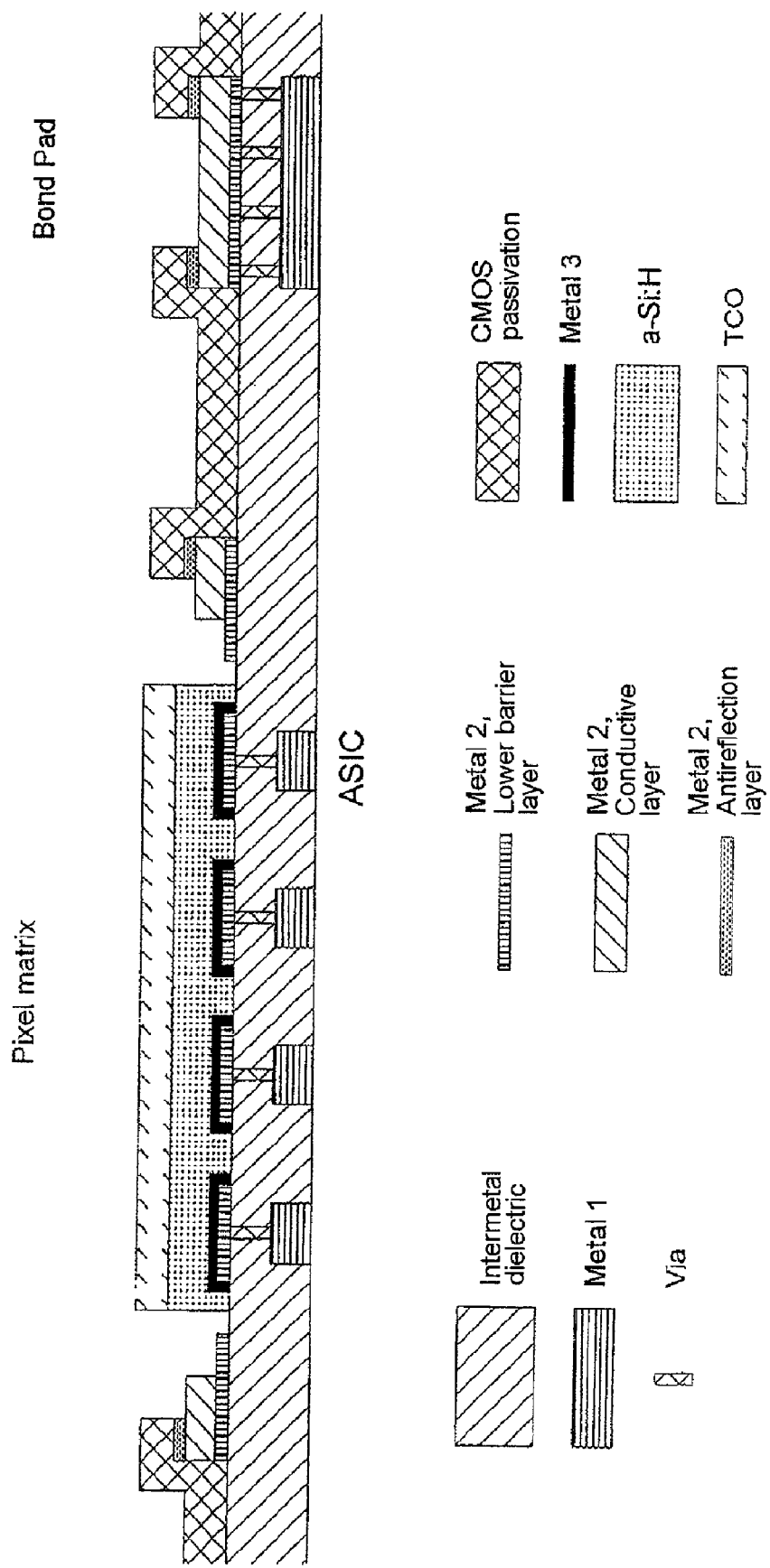
FIG. 8 illustrates another process variant.
Figure 9:
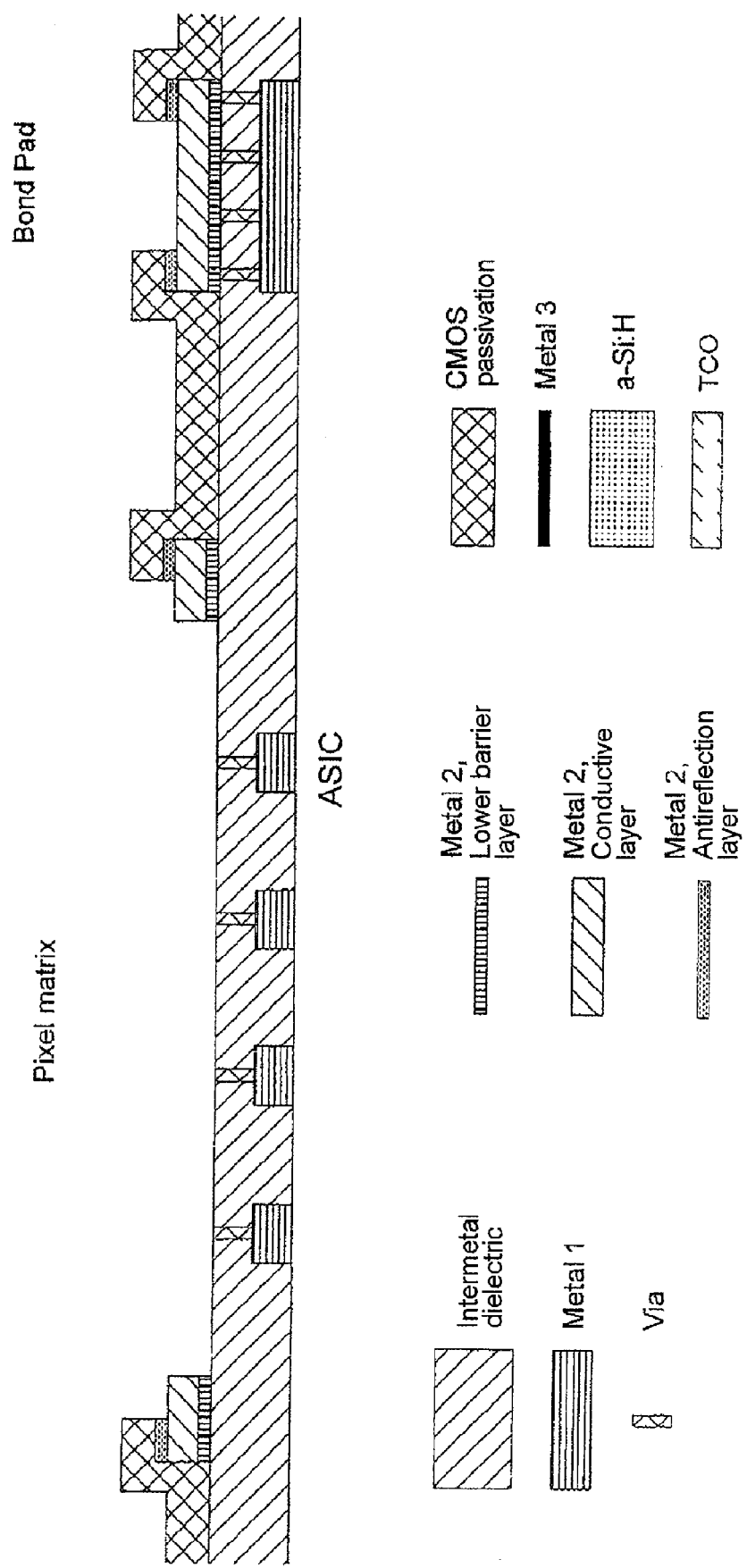
FIG. 9 illustrates still a further process variant.
Figure 10:
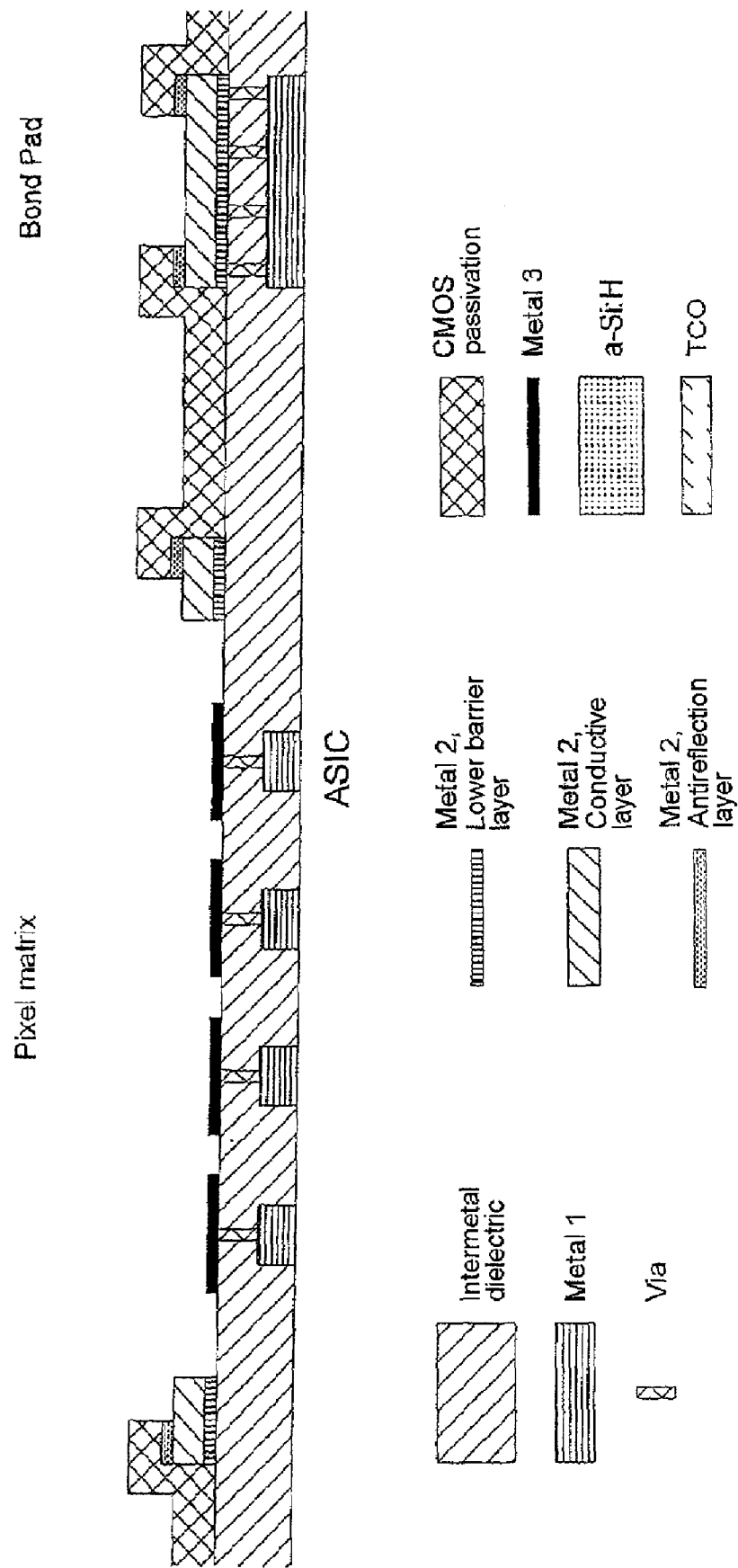
FIG. 10 illustrates the further metal layer deposited directly onto the intermetal dielectric forming the pixel back electrodes after patterning.

FIG. 5 documents the result after the patterning of the lower barrier layer. This produces the pixel back electrodes, which are subsequently coated with the multilayer system comprising amorphous silicon and TCO (FIG. 6). FIGS. 7 and 8 show a process variant in which, proceeding from the situation according to FIG. 5, the patterned regions of the lower barrier layer are covered by a further patterned metal layer before the deposition of the photodiode. Beginning with FIG. 9, a further variant is illustrated in which, after the situation outlined in FIG. 4, the lower barrier layer of the topmost metallization layer of the ASIC is completely removed. The further metal layer is subsequently deposited directly onto the intermetal dielectric, and forms the pixel back electrodes after patterning (FIG. 10). The photodiode-forming layers are then applied thereto (FIG. 11).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A TFA (thin film on ASIC) image sensor, comprising:
an intermetal dielectric layer disposed over an ASIC;
a plurality of pixel back electrodes disposed over the intermetal dielectric layer;
a plurality of vias formed in the intermetal dielectric layer and in contact with the plurality of pixel back electrodes;
a plurality of metal contacts formed in the intermetal dielectric layer, connected to the plurality of vias, and in contact with the ASIC;
an intrinsic absorption layer disposed over the plurality of pixel back electrodes, the intrinsic absorption layer having a thickness of between 300 nm and 600 nm; and
a transparent conductive oxide (TCO) layer disposed over the intrinsic absorption layer.

2. The TFA image sensor as claimed in claim 1, wherein the thickness of the intrinsic absorption layer is approximately 450 nm.

3. The TFA image sensor as claimed in claim 1, wherein a band gap of the intrinsic absorption layer is increased.

4. The TFA image sensor as claimed in claim 3, wherein the increase in the band gap is realized by using an amorphous silicon-carbon alloy (a-Sic:H) as the intrinsic absorption layer.

5. The TFA image sensor as claimed in claim 1, wherein the plurality of pixel back electrodes includes a lower barrier layer.

6. The TFA image sensor as claimed in claim 1, wherein the plurality of pixel back electrodes includes a conductive layer disposed over a lower barrier layer.

7. The TFA image sensor as claimed in claim 1, wherein the pixel matrix in the ASIC is coated with a passivation.

8. The TFA image sensor as claimed in claim 1, wherein the plurality of back electrodes are connected via a planar topmost CMOS metal plane.

9. The TFA image sensor as claimed in claim 8, wherein the topmost CMOS metal plane is situated on a CMP-planarized surface (CMP=Chemical Mechanical Polishing) of the intermetal dielectric layer.

10. A method for fabricating a TFA image sensor that includes a plurality of photodiodes disposed on an ASIC, the method comprising:

A) before fabrication of the photodiodes, removing a topmost metal layer of the ASIC;

B) disposing a matrix of thin metal electrodes above the ASIC, the thin metal electrodes forming back electrodes of the photodiodes; and C) patterning the matrix in a pixel raster.

11. The method as claimed in claim 10, wherein A) comprises removing an antireflection layer and the topmost metal layer such that only a lower barrier layer remains.

12. The method as claimed in claim 10, wherein A) comprises completely removing the topmost metal layer.

13. The method as claimed in claim 10 further comprising opening an ASIC passivation in a photoactive region of the TFA image sensor.

14. The method as claimed in claim 10, wherein A) comprises removing an antireflection layer of an upper metallization layer of the ASIC in a photoactive region of the TFA image sensor.

15. The method as claimed in claim 10, wherein A) comprises removing a conductive layer of an upper metallization layer of the ASIC in a photoactive region of the TFA image sensor.

16. The method as claimed in claim 10, wherein A) comprises patterning or removing a lower barrier layer of an upper metallization layer of the ASIC in a photoactive region of the TFA image sensor.

17. The method as claimed in claim 16, further comprising depositing and patterning a thin metal layer.

18. The method as claimed in claim 17 further comprising depositing and patterning at least one more layer including at least one color filter layer.

19. A method for fabricating a TFA image sensor on an ASIC, the method comprising:
    opening a passivation of the ASIC in a photoactive region of the TFA image sensor;
    removing an antireflection layer of the upper metallization layer of the ASIC in the photoactive region of the TFA image sensor;
    removing a conductive layer of the upper metallization layer of the ASIC in the photoactive region of the TFA image sensor;
    patterning or removing a lower barrier layer of the upper metallization layer of the ASIC in the photoactive region of the TFA image sensor;
    depositing and patterning at least one metal layer;
    depositing and patterning an intrinsic absorption layer and a transparent conductive oxide layer; and
    depositing and patterning at least one additional layer, including at least one color filter layer.

20. An apparatus, comprising:
    at least one photodiode formed on an ASIC, the at least one photodiode comprising:
    a dielectric layer disposed over the ASIC;
    at least one electrode disposed over the dielectric layer;
    an intrinsic absorption layer disposed over the at least one electrode, and
    a transparent conductive oxide (TCO) layer disposed over the intrinsic absorption layer.

21. The apparatus of claim 20, wherein the dielectric layer comprises a plurality of vias formed therein.

22. The apparatus of claim 21, wherein the dielectric layer further comprises a plurality of metal contacts formed therein, wherein the plurality of metal contacts connect the plurality of vias to the ASIC.

23. The apparatus of claim 20, wherein the intrinsic absorption layer has a thickness between 300 nm and 600 nm.

24. The apparatus of claim 20, wherein the intrinsic absorption layer comprises an amorphous silicon-carbon alloy (a-Sic:H).

25. The apparatus of claim 20, wherein the at least one electrode includes a lower barrier layer.

26. The apparatus of claim 25, wherein the at least one electrode includes a conductive layer disposed over the lower barrier layer.

27. The apparatus of claim 20, wherein the at least one electrode is connected via a planar topmost CMOS metal plane.

28. The apparatus of claim 27, wherein the topmost CMOS metal plane is situated on a CMP-planarized surface (CMP=Chemical Mechanical Polishing) of the dielectric layer.

* * * * *